United States Patent [19]
Grivna et al.

[11] Patent Number: 5,447,874
[45] Date of Patent: Sep. 5, 1995

[54] METHOD FOR MAKING A SEMICONDUCTOR DEVICE COMPRISING A DUAL METAL GATE USING A CHEMICAL MECHANICAL POLISH

[76] Inventors: Gordon Grivna, 565 W. Laguna Azul, Mesa, Ariz. 85210; Bruce A. Bernhardt, 4166 W. Orchid La., Chandler, Ariz. 85226; Gerald Keller, 841 Santa Ana St., Chandler, Ariz. 85224

[21] Appl. No.: 282,360

[22] Filed: Jul. 29, 1994

[51] Int. Cl.⁶ .................................. H01L 21/338
[52] U.S. Cl. .................................. 437/40; 437/41; 437/177; 437/192; 437/912
[58] Field of Search ............ 437/41, 44, 912, 203, 437/228, 229, 40, 39, 184, 192, 177; 156/636

[56] References Cited

U.S. PATENT DOCUMENTS

| | | | |
|---|---|---|---|
| 4,532,695 | 8/1985 | Schnermeyer | 437/184 |
| 4,745,082 | 5/1988 | Kwok | 437/39 |
| 4,782,032 | 11/1988 | Geidssberger et al. | 437/41 |
| 4,808,545 | 2/1989 | Balasubramanyam et al. | 437/41 |
| 4,944,836 | 7/1990 | Beyer et al. | 156/645 |
| 4,963,501 | 10/1990 | Ryan et al. | 437/40 |
| 5,173,449 | 12/1992 | Lorenzen et al. | 437/192 |
| 5,262,354 | 11/1993 | Cote et al. | 437/195 |
| 5,286,676 | 2/1994 | Kruger et al. | 437/190 |

FOREIGN PATENT DOCUMENTS

| | | | |
|---|---|---|---|
| 58-60535 | 4/1983 | Japan | 437/192 |
| 1-24466 | 1/1989 | Japan | 437/912 |

OTHER PUBLICATIONS

Kaanta et al., "Dual Damascene: A Ulsi Wiring Technology" presented at VMIC Conference Jun. 11–12, 1991 IEEE, pp. 144–152.

O'Neill et al., "A Simplified Refractory Gate Process for High Performance GaAs FETs," Defensive Publication, Motorola, Inc., Technical Developments, vol. 17, Dec. 1992, pp. 138–139.

*Primary Examiner*—T. N. Quach
*Attorney, Agent, or Firm*—Aaron B. Bernstein

[57] ABSTRACT

A method of manufacturing a semiconductor device gate is provided that reduces gate length variability while maintaining self-alignment and eliminating etch damage and substrate contamination. A gate opening (18) is formed in an oxide layer (16) using a anisotropic etch. The anisotropic etch creates a reverse gate metal image that has low gate length variability. Dual metal gate (26) is then deposited. The excess gate metal is then removed and the top surface (31) of the gate (30) planarized using a chemical mechanical polish. The remaining oxide (16) is then removed, leaving a precise gate (30). The use of a nitride barrier (12) and of an etchstop layer (14) of aluminum nitride under the oxide layer (16) is also shown.

10 Claims, 6 Drawing Sheets

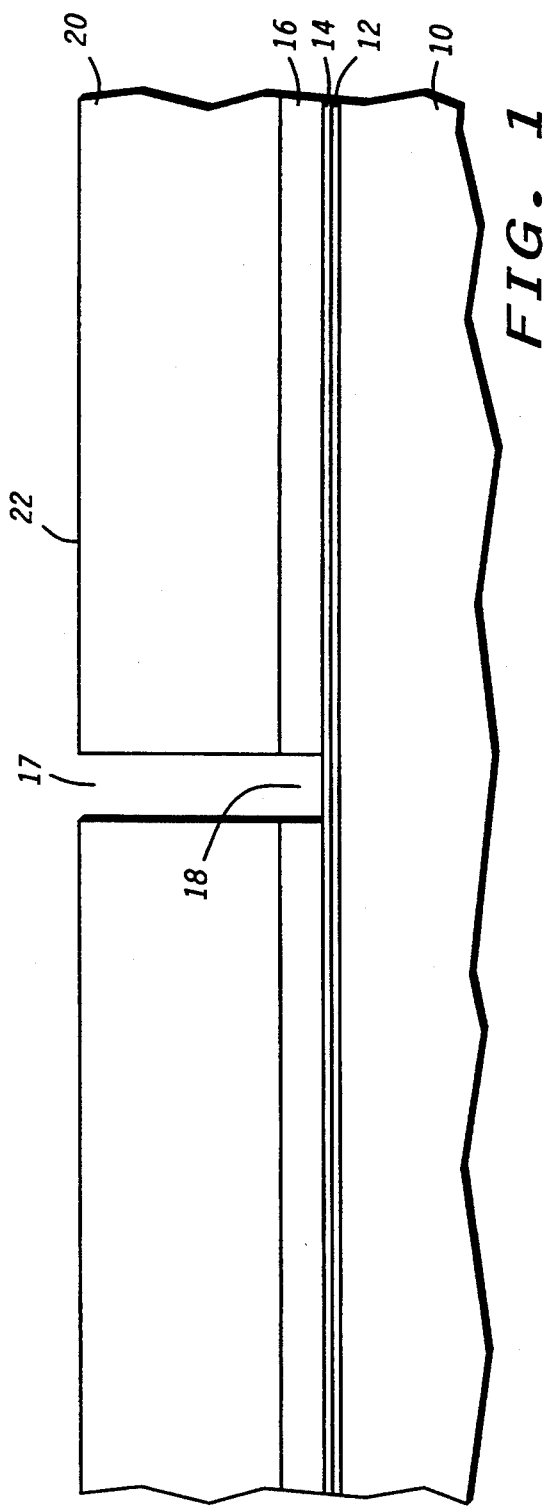
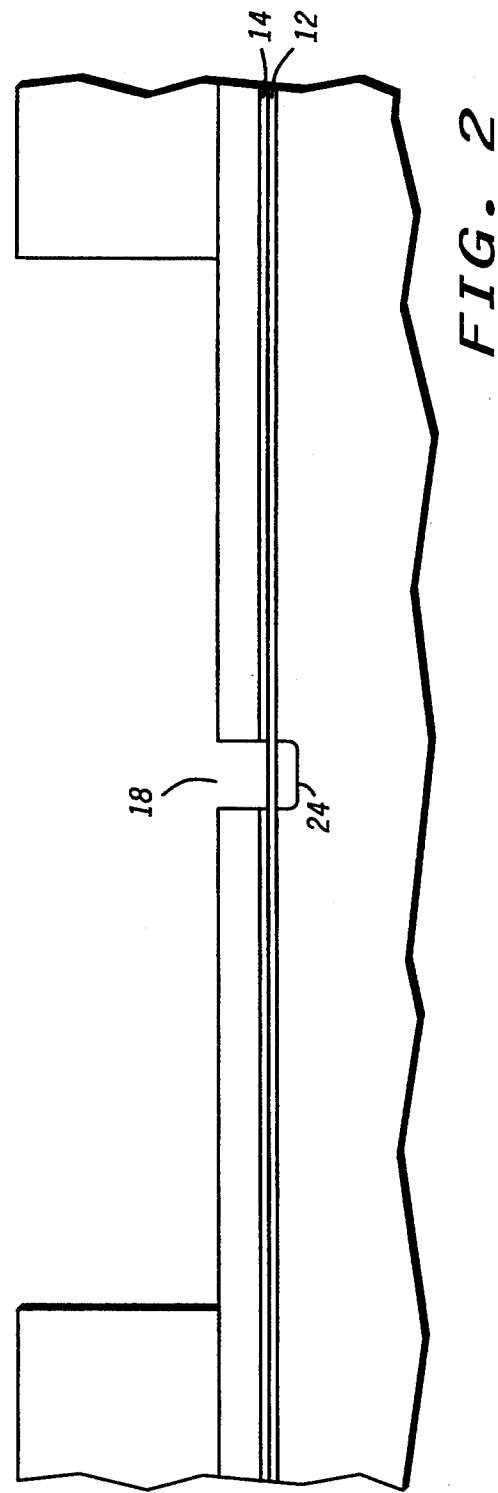

5,447,874

METHOD FOR MAKING A SEMICONDUCTOR DEVICE COMPRISING A DUAL METAL GATE USING A CHEMICAL MECHANICAL POLISH

FIELD OF THE INVENTION

The present invention relates, in general, to semiconductor device production, and more particularly, to gate fabrication techniques for use in semiconductor production.

BACKGROUND OF THE INVENTION

The ever increasing density of semiconductor devices in integrated circuit manufacturing requires ever increasing precision in device manufacturing. Of particular importance is the ability to control the gate length in field effect transistors (FETs). Without the ability to shorten gate length, an increase in density and circuit performance could not be accomplished.

Current FET gate manufacturing methods result in non-uniform gate length, circuit damage from reactive ion etch (RIE) of the gate lines, and/or require additional processing steps. For example, a substitutional gate method of producing FET gates uses an oxide plug that is created using an anisotropic etch. The oxide plug is then coated with polymer and its surface is planarized. The plug is then removed and substituted by gate metal through lift-off techniques. There are several disadvantages in using the oxide plug method. First, it requires a large increase in photo and process steps. Second, spacers cannot be used in an oxide plug method to reduce gate size. Third, the lift-off technique severely limits the size and thickness of the gate metal line making the process virtually impossible for sub micron gate lengths.

Another method again uses an anisotropic dielectric etch process to control gate length by etching an opening instead of a plug. A dielectric is deposited then the gate opening is anisotropically RIE etched down to the substrate to define gate dimensions. The opening is filled with the gate material and the top surface of the gate line is then patterned with photoresist and etched. Again there are several disadvantages to this method. Since the gate is patterned and etched leaving full thickness on top of the remaining oxide, the planarity of the device is lost, requiring additional dielectric planarization techniques prior to routing interconnect metallization. In addition, spacer technology cannot be used. Without spacer technology, it is difficult to optimize for high device performance without introducing drain induced barrier lowering or device breakdown control problems. This limits the performance and scaleability of the device.

A third method for controlling gate length would be a low pressure, high plasma density, RIE etch tool which typically etches material in the five to ten millitor range. Under these conditions, an anisotropic etch of the gate material can be obtained. Again there are several disadvantages to this method. Damage and contamination from the gate material deposition and etch process can degrade device performance by creating surface states or destroying the crystal structure of the semiconductor. Also, the gate dimension cannot be reduced below the capability of the photoresist alignment tool since sidewall spacers cannot be used to shrink the gate opening beyond its resolution capability.

A damage and contamination free method of reducing gate length variability without an increase in processing steps that provides self-alignment and scaleability is needed.

BRIEF DESCRIPTION OF THE DRAWINGS

FIG. 1 is a cross-sectional side view illustrating a method of manufacturing a semiconductor device;

FIG. 2 is a cross-sectional side view illustrating a method of manufacturing a semiconductor device;

SUMMARY OF THE INVENTION

Figure 3:
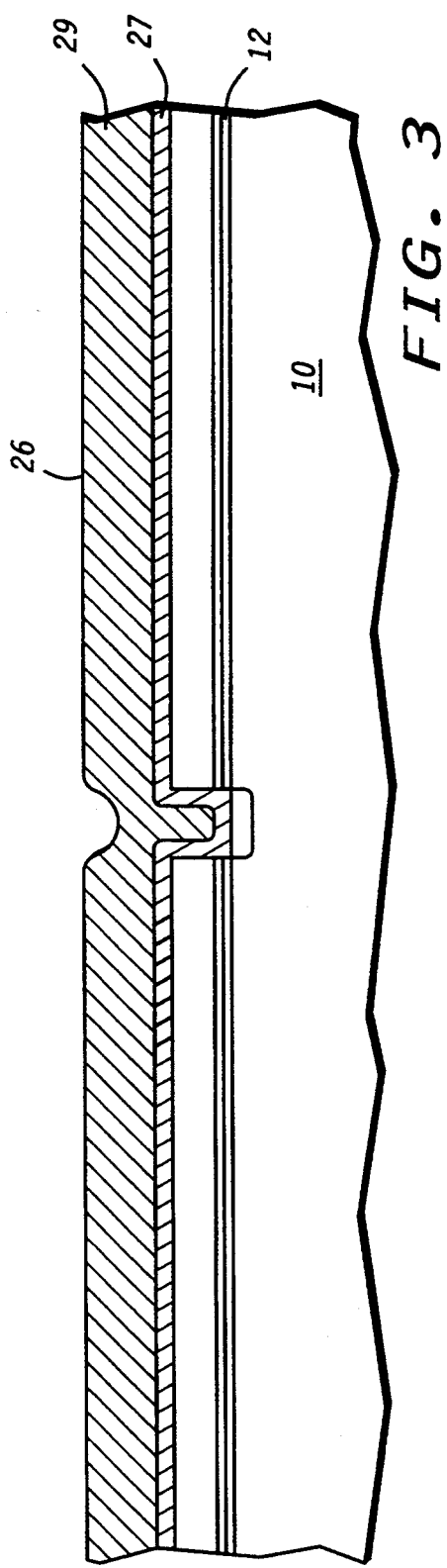
FIG. 3 is a cross-sectional side view illustrating a method of manufacturing a semiconductor device.

The present invention relates to a method of producing semiconductor devices that improves gate length control, eliminates surface damage contamination and leakage problems and does not increase processing steps. The method also reduces nonplanarity to simplify further interconnect processing.

The present invention method uses field oxide as a "mask" for the gate metal. A gate metal opening is anisotropically etched in the oxide. Using the field oxide as a mask for gate metal reduces gate length variability. After the gate metal is deposited the gate metal above the top surface of the oxide is removed using a chemical mechanical polish. The oxide mask is then wet stripped away. The gate metal remains to act as a self-aligned implant mask for implanting active regions.

The method of the present invention also uses a single buried aluminum nitride layer to provide etch stop for all oxide etch steps. Etch stop layers reduce contamination and damage to the substrate surface. This method provides complete protection of the substrate with a single etch stop layer. Thus, a reduction of contamination is obtained without increasing processing steps.

Additionally, the process uses a two-step patterned sidewall spacer on the gate metal layer. The two-stepped patterned spacer process retains self-alignment and eliminates the need for extra photoresist steps to separately pattern source/drain implants and contact openings. It also gives self-aligned contacts to the gate metal allowing for further process scaleability. The two-stepped patterned spacer process provides dielectric of the same thickness over both contacts and gate. This allows the source and drain contacts and contacts to gate to be opened during the same etch step with a single photoresist mask. Because the critical area under the spacer is never touched by a plasma or wet etch surface damage and contamination are eliminated.

DESCRIPTION OF THE PREFERRED EMBODIMENTS

Turning now to the figures for a more detailed description of the preferred embodiments, FIG. 1 is a cross-sectional side view illustrating a semiconductor manufacturing process. In one embodiment, a barrier layer, such as a nitride layer 12 is deposited upon a substrate of gallium arsenide 10. The nitride 12 is typically approximately 350 Å thick. The nitride 12 serves to block out diffusion of arsenic during high temperature processing.

A etch stop layer, such as an aluminum nitride layer 14 is then deposited upon the nitride 12. The aluminum nitride 14 serves as an etch stop. The layer of aluminum nitride 14 is typically 200 Å thick. The aluminum nitride 14 provides an etch stop that protects the substrate 10 throughout the manufacturing process.

A dielectric layer, such as an oxide layer 16 is formed upon the layer of aluminum nitride 14. The oxide layer 16 is typically 2500 Å thick and is any type of silicon oxide such as those formed with silane or tetraethylortho silicate precursor gas (TEOS). A layer of photoresist 20 is deposited and then patterned to make a patterned opening 17. The top surface 22 of the photoresist 20 provides a planar surface for the manufacturing stepper to focus upon. The planar surface 22 allows the use of more accurate phase-shift masks for defining the patterned opening 17.

A gate opening 18 is then etched through the oxide layer 16. The etching is preferably done with an anisotropic RIE etch. Because the etch is anisotropic, it provides for more precise gate length control. The aluminum nitride layer 14 is then removed from the area of the gate opening 18 during subsequent wet processing.

Turning now to FIG. 2, FIG. 2 is a cross-sectional side view illustrating a method of manufacturing a semiconductor device. Following the steps shown in FIG. 1, an active area photo resist layer 20 is aligned and developed using a developer which contains ammonium hydroxide. This step also removes the exposed aluminum nitride layer 14. An implant 24 is then implanted through the gate opening 18. Removing the nitride layer 12 from the area of the gate opening 18 before making the active area implant 24 is also possible.

Turning now to FIG. 3, FIG. 3 is a cross-sectional side view illustrating a method of manufacturing a semiconductor device. Following the steps illustrated in FIG. 2, the nitride layer 12 is removed from the area of gate opening 18. This is preferably accomplished with a dry plasma etch using a low damage etch gas such as $SF_6$ or $NF_3$. This etch is used because it does not damage the gallium arsenide substrate 10.. The etch is slightly isotropic but well within gate variation limits.

The gate metal 26 is then formed. In one embodiment the gate metal comprises two layers of metal, deposited in two steps. The first layer 27 deposited is preferably approximately 500 Å of titanium tungsten nitride (TiWN). In the preferred embodiment the deposited TiWN comprises approximately 12% titanium. The second layer 29 is approximately 4000 Å of titanium tungsten (TiW). Again, in the preferred embodiment the TiW comprises approximately 12% titanium. Alternatively the second layer 29 could comprise aluminum copper (AlCu) or other interconnect metal. These combinations of gate metal provide low resistivity but with the contact stability of TiWN.

In another embodiment, a set of vertical spacers are set in the gate opening 18 before the gate metal is deposited. The spacers serve to decrease the gate metal width opening beyond the capability of the photolithography tools. This is particularly useful in digital applications.

Figure 4:
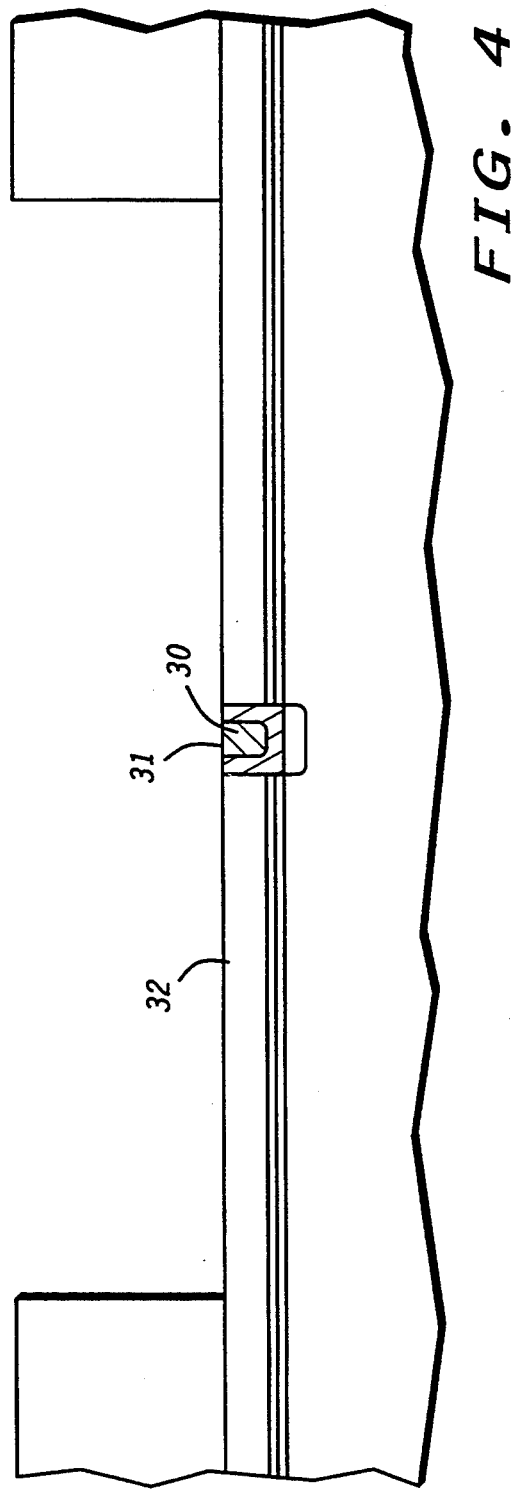
FIG. 4 is a cross-sectional side view illustrating a method of manufacturing a semiconductor device.

Turning now to FIG. 4, FIG. 4 is a cross-sectional side view illustrating a method of manufacturing a semiconductor device. After completing the steps illustrated in FIG. 3, the excess gate metal is removed and the top surface of the gate 31 planarized using either a chemical mechanical polish (CMP) or other etch back planarization process. This creates the desired shape of the gate 30.

A CMP removes the excess gate metal 26 and planarizes by physically eroding the gate metal and stopping selectively on the oxide layer 32.

The top surface of the gate 31 can also be defined using a patterned or spin on resist planarization and etch back process or etch back alone if the gate lines are of small enough dimensions.

Using the CMP or etch back process allows the dual gate metal layer 26 of FIG. 3. Normally, the use of the dual gate metal layers increases the variability of gate lengths because the two metals have different etch rates. Here, the gate metal is not etched and hence does not suffer that disadvantage.

Figure 5:
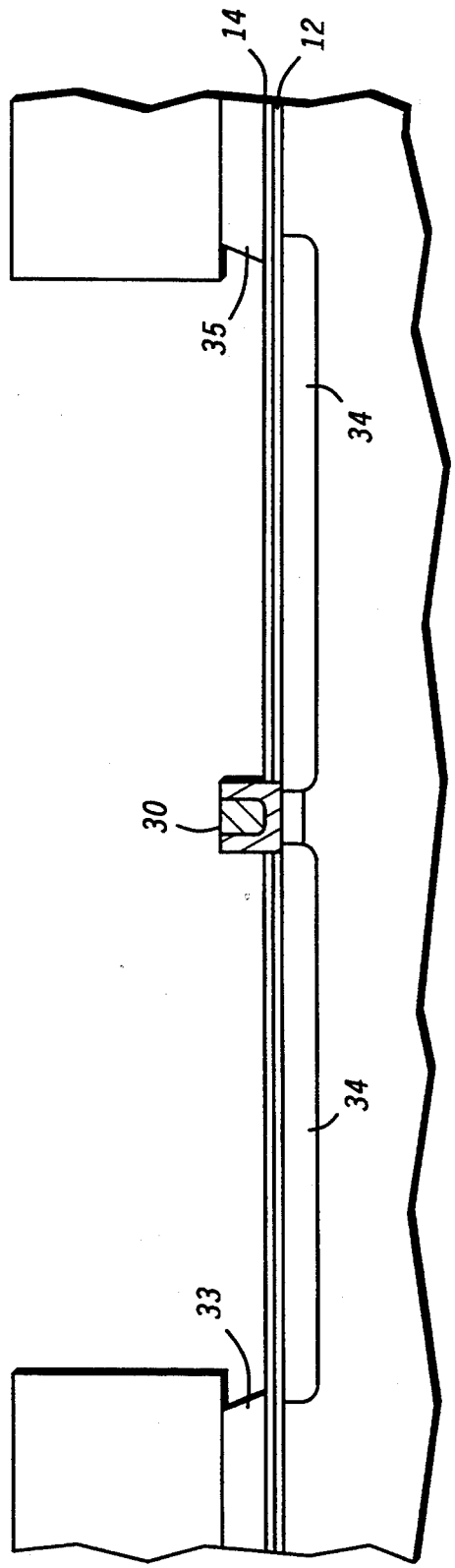
FIG. 5 is a cross-sectional side view illustrating a method of manufacturing a semiconductor device.

Turning now to FIG. 5, FIG. 5 is a cross-sectional side view illustrating a method of manufacturing a semiconductor device. Following the steps illustrated in FIG. 4, a wet etch is used to remove the remaining oxide 32 (of FIG. 4) from around the gate 30. Portions of the oxides 33 and 35 may be retained to decrease nonplanarity. Preferably a wet etch is used that removes the oxide layer 32 from around the gate 30 while not removing the aluminum nitride layer 14, or an aluminum nitride layer can be redeposited if required. The nitride layer 12 remains to keep the gallium arsenide substrate free from damage and contamination.

At this point a precise gate metal line has been provided upon the gallium arsenide substrate. Implants 34 can now be added to reduce access resistance. The gate 30 acts as an implant block so the implants 34 remain self-aligned.

Figure 6:
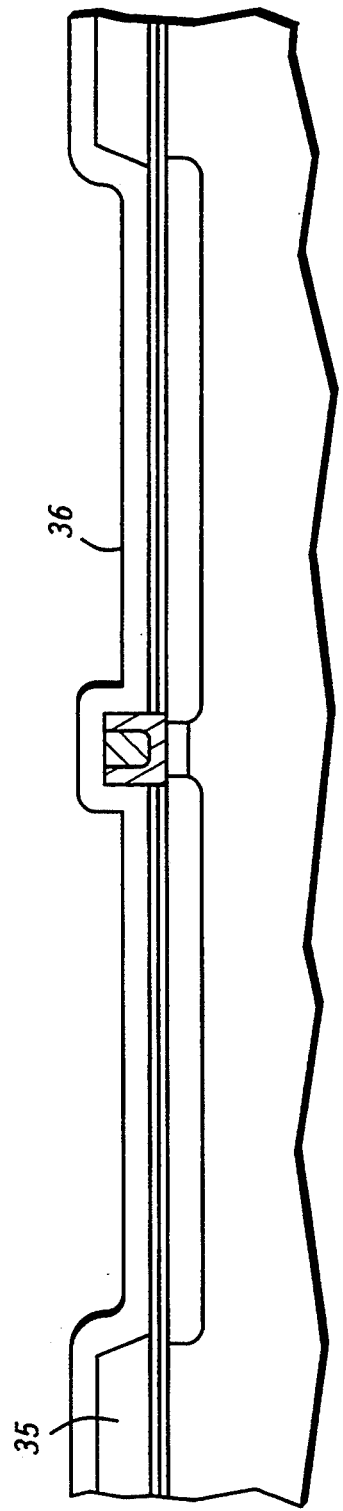
FIG. 6 is a cross-sectional side view illustrating a method of manufacturing a semiconductor device.
Figure 7:
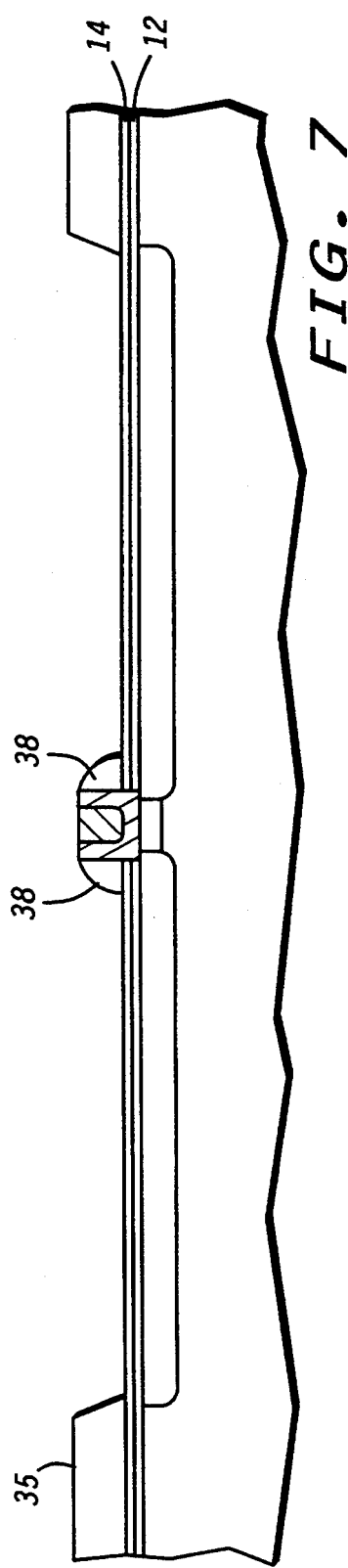
FIG. 7 is a cross-sectional side view illustrating a method of manufacturing a semiconductor device.
Figure 8:
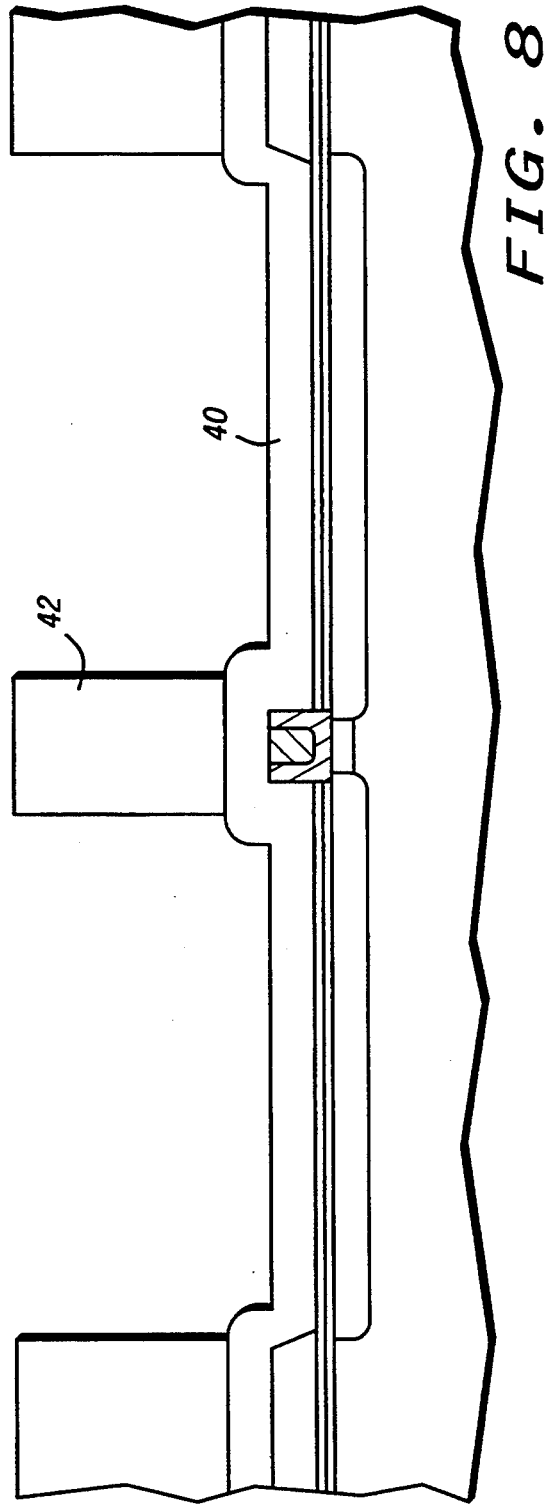
FIG. 8 is a cross-sectional side view illustrating a method of manufacturing a semiconductor device.

Turning now to FIG. 6, FIG. 6 is a cross-sectional side view illustrating a method of manufacturing a semiconductor device. After the steps illustrated in FIG. 5, a dielectric layer, such as isotropic first oxide layer 36 is deposited on the device. The first oxide layer 36 is typically deposited isotropically 2500 Å thick. A portion of the first oxide layer 36 is then etched anisotropically as illustrated in FIG. 7. The etch creates sidewall spacers 38. At this point another implant could be performed if desired. A second dielectric layer, such as a second oxide layer 40 is then deposited upon the device as illustrated by FIG. 8. The second oxide layer 40 deposited is typically deposited isotropically approximately 2500 Å thick.

Figure 9:
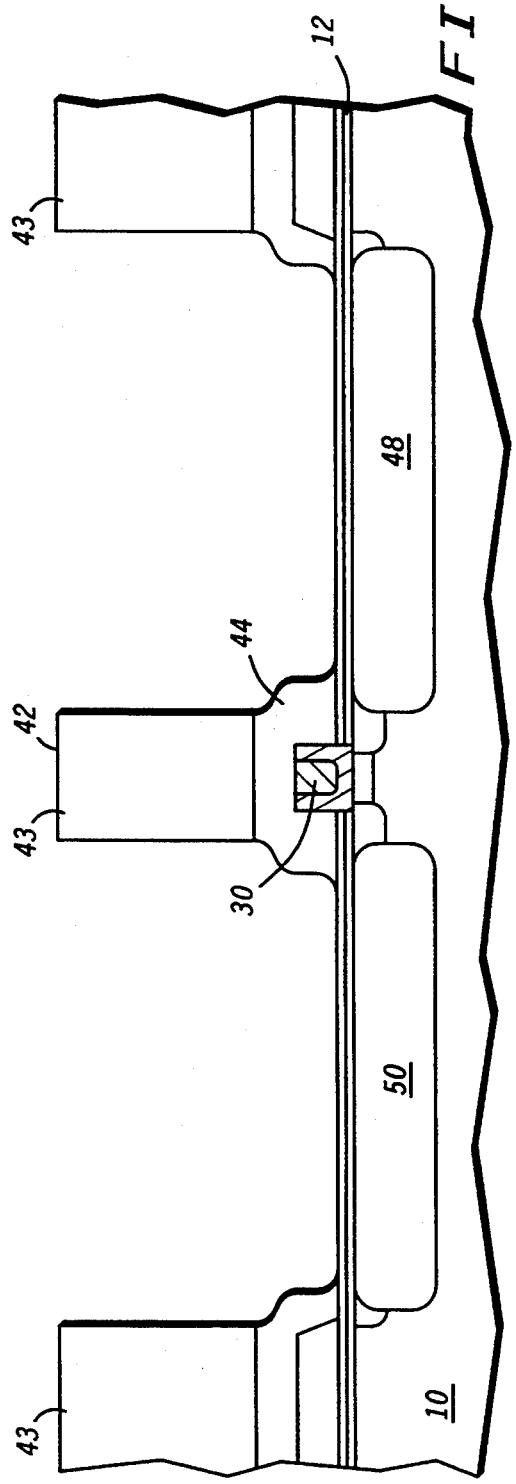
FIG. 9 is a cross-sectional side view illustrating a method of manufacturing a semiconductor device.

Turning now to FIG. 9, FIG. 9 is a cross-sectional side view illustrating a method of manufacturing a semiconductor device. A patterned photoresist mask 43 is then formed over the device and the oxide layer 40. The photoresist mask 43 defines an oxide opening that is slightly (within alignment tolerances of the exposure tool) smaller than the final opening size desired. The patterned photoresist mask 43 includes a spacer mask 42. The spacer mask 42 protects the gate during processing.

The exposed oxide is etched anisotropically, stopping on the aluminum nitride etch stop layer 14 as illustrated in FIG. 9. This results in a spacer 44 which encapsulates the gate line with dielectric without severely increasing nonplanarity yet provides a self-aligned source drain contact opening with a single photoresist step. This single photoresist step could also simultaneously open up any desired contacts to gate metal lines.

The photoresist mask 43 and aluminum nitride layer 14 are then wet stripped and implants 48 and 50 are implanted into the substrate 10. The spacer 44 acts as an implant mask for implants 48 and 50, maintaining self alignment of the implants 48 and 50 with the gate 30. The implants 50 and 48 are the source and drain implants for the FET.

Figure 9A:
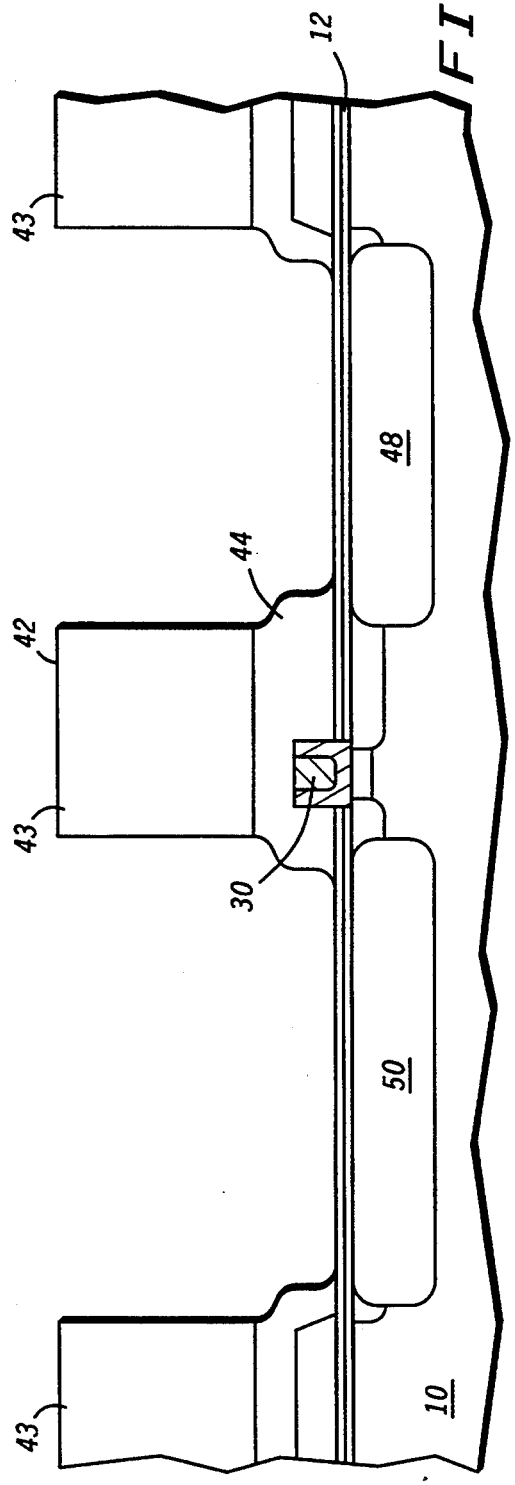
FIG. 9A is a cross-sectional side view illustrating a method of manufacturing a semiconductor device.

An alternate embodiment is shown in FIG. 9A. In this embodiment the spacer mask 42 is extended over a side of the gate line. The spacer mask 42 is extended to further separate the drain region from the gate line with dielectric. This would create a lightly doped drain (LDD) region, if desired for circuit performance.

Figure 10:
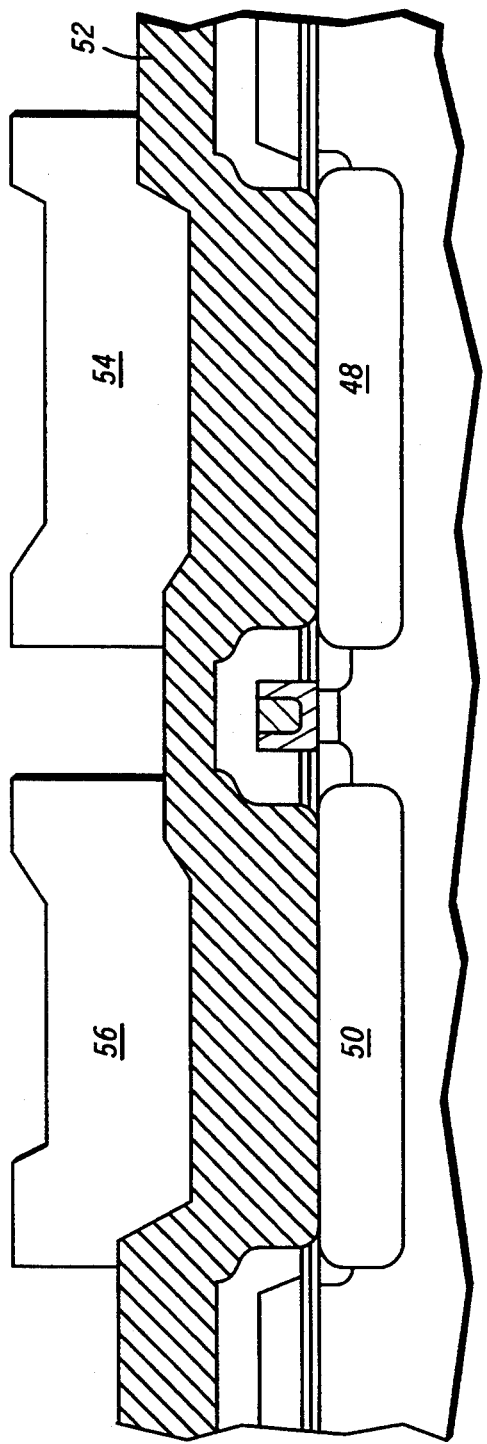
FIG. 10 is a cross-sectional side view illustrating a method of manufacturing a semiconductor device.
Figure 11:
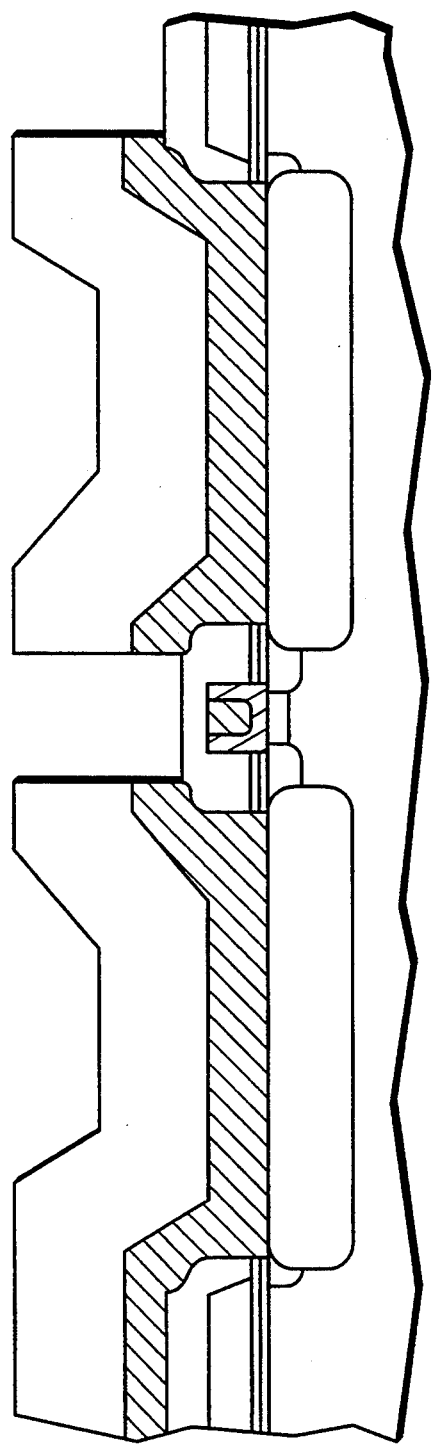
FIG. 11 is a cross-sectional side view illustrating a semiconductor device.

Turning now to FIG. 10, FIG. 10 is a cross-sectional side view illustrating a method of manufacturing a semiconductor device. After the steps illustrated in FIG. 9, the nitride layer 12 is removed above the implants 48 and 50. An interconnect metal structure 52 which provides ohmic contact to the source and drain regions 48 and 50 is then deposited over the entire device. If optimal planarity is desired the ohmic metal above the oxide layer 40 can be removed with CMP. However, in the preferred embodiment patterned photoresists 54 and 56 are formed. A portion of interconnect metal structure 52 is removed between the source and drain regions allowing for the metal interconnect routing and ohmic contact in one step. The completed device is then as shown in FIG. 11.

It should now be appreciated that an improved method of manufacturing a semiconductor device has been provided. The method disclosed allows for self-alignment while eliminating etch damage to the devices, reducing processing and photo steps and increasing scaleability beyond the capabilities of I-line stepper tools.

While specific embodiments of the method of the present invention have been shown, further modifications and improvements will occur to those skilled in the art. Consequently, it should be understood that this invention is not limited to the particular embodiment shown, but rather intended to cover all modifications which lie within the scope of the following claims.

We claim:

1. A method for making a semiconductor device comprising the steps of:
   a) providing a substrate having a barrier layer upon the substrate, and an etch stop layer upon the barrier layer;
   b) forming a dielectric layer upon the etched stop layer;
   c) forming a gate metal mask from the dielectric layer, the gate metal mask having a gate opening;
   d) removing a portion of the barrier layer exposed by the gate opening;
   e) forming a dual metal gate metal layer;
   f) removing a portion of the gate metal layer and planarizing a top gate surface using a chemical mechanical polish, thereby forming a dual metal gate line; and
   g) subsequently exposing the dual metal gate line by removing at least a portion of the dielectric layer around the dual metal gate line.

2. The method as in claim 1 wherein the etch stop layer comprises aluminum nitride.

3. The method as in claim 2 wherein the step of forming a gate metal layer comprises depositing a first gate metal layer and depositing a second gate metal layer.

4. The method as in claim 3 wherein the first gate metal layer comprises TiWN and the second gate metal layer comprises TiW.

5. The method as in claim 1 wherein the step of forming a gate metal opening comprises anisotropically etching the dielectric layer.

6. The method as in claim 5 wherein the dielectric layer comprises an oxide layer.

7. The method as in claim 1 wherein the dielectric layer comprises an oxide layer.

8. The method as in claim 1 wherein the barrier layer comprises a nitride layer.

9. A method for making semiconductor device comprising the steps of:
   a) forming a nitride layer upon a gallium arsenide substrate;
   b) forming an aluminum nitride layer upon the nitride layer;
   c) forming an oxide layer upon the aluminum nitride layer;
   d) anisotropically etching a gate metal mask through the oxide layer, the gate metal mask having a gate opening;
   e) forming an active area in the substrate beneath the gate metal opening;
   g) removing a portion of the nitride layer exposed by the gate opening;
   h) forming a first gate metal layer;
   i) forming a second gate metal layer;
   j) removing a portion of the first and second gate metal layers and planarizing a top gate surface using a chemical/mechanical polish, thereby forming a dual metal gate line; and
   k) subsequently exposing the dual metal gate line by removing at least a portion of the oxide layer around the gate metal.

10. The method as in claim 9 wherein the first gate metal layer comprises TiWN and the second gate metal layer comprising TiW.

* * * * *